United States Patent [19]

Yorkanis

[11] 4,257,009
[45] Mar. 17, 1981

[54] INHIBIT CIRCUIT FOR A DIFFERENTIAL AMPLIFIER

[75] Inventor: Bernard J. Yorkanis, S. Plainfield, N.J.

[73] Assignee: RCA Corporation, New York, N.Y.

[21] Appl. No.: 41,752

[22] Filed: May 23, 1979

[51] Int. Cl.³ .............................................. H03F 3/45
[52] U.S. Cl. ..................... 330/51; 330/258; 330/259
[58] Field of Search .................. 330/69, 51, 252, 258, 330/259, 254; 328/99; 307/243

[56] References Cited

U.S. PATENT DOCUMENTS

| | | | |
|---|---|---|---|
| 3,072,853 | 1/1963 | Buffington et al. | 328/99 |
| 3,371,160 | 2/1968 | Hurford | 178/7.1 |
| 3,430,154 | 2/1969 | Harwood | 330/285 |
| 3,651,418 | 3/1972 | Wittman | 329/50 |
| 3,707,603 | 12/1972 | Limberg | 179/15 BT |

Primary Examiner—James B. Mullins
Attorney, Agent, or Firm—E. M. Whitacre; J. S. Tripoli; R. G. Coalter

[57] ABSTRACT

The outputs of a pair of non-additive combiners are coupled to respective inputs of a differential amplifier and an a.c. signal to be amplified is applied to a selected input of one of the combiners. A control circuit operates in a first mode to apply control voltages to the combiner inputs for causing the one combiner to block the a.c. signal and also causing both combiners to apply a common mode input voltage of a first value to the amplifier inputs. In a second mode, the control circuit changes the values of the control voltages in a sense to cause the one combiner to pass the a.c. signal and to also cause both combiners to apply a common mode input voltage of a second value to the amplifier inputs whereby, in either mode, the amplifier produces a constant quiescent d.c. output voltage.

2 Claims, 4 Drawing Figures

INHIBIT CIRCUIT FOR A DIFFERENTIAL AMPLIFIER

This invention relates to circuits and particularly to circuitry of a type for inhibiting the operation of a differential amplifier in response to a control signal and which includes provisions for preventing a change in the quiescent d.c. output level of the amplifier when inhibited.

Transient free operation of an inhibitable amplifier is particularly important in applications where the amplifier is used for signal squelching. For example, an unsuppressed d.c. transient in an audio squelch circuit could cause an annoying "thump" to be produced by the loudspeaker. In video squelching, a d.c. transient could result in such severe signal distortion as to prevent proper detection of the picture synchronizing signals.

A known transient free inhibit circuit for an amplifier is described in U.S. Pat. No. 3,651,418 entitled "Synchronous Detector Circuit" which issued to E. J. Wittman on Mar. 21, 1972. The Wittman inhibit circuit is disclosed in the context of a synchronous detector which includes a differential amplifier. The amplifier is inhibited by: (1) applying an inhibit voltage to the emitter electrodes of the input transistors which is greater than the commonmode input voltage at their base electrodes; and (2) coupling the output of the emitter current source directly to the collector load resistors. By these steps the input transistors are disabled since their base-emitter junctions are reverse biased and the collector load resistors receive reverse biased and the collector load resistors receive the same quiescent current that they did before the inhibit voltage was applied so that the amplifier gain is reduced to zero without any change in the quiescent voltage of its outputs.

One problem with the known inhibit circuit is that it requires modification of the differential amplifier itself and so may not be used in cases where the internal nodes of the amplifier are not accessible. A second problem is that to apply Wittman's solution one must first know the expected value or maximum probable value of the common-mode input voltage in order to be able to select the proper value of the inhibit voltage. In some applications, however, the common-mode input voltage may not be known beforehand.

A generally known technique for inhibiting an amplifier comprises connecting the conduction path of a bipolar or field effect transistor between the input signal source and the input of the amplifier. Operation is then controlled by applying appropriate signals to the transistor control electrode (gate or base). While such an approach has the virtue of simplicity it does not solve the problem of output level shifting and moreover the transistor introduces undesirable series resistance in the input circuit which may affect the amplifier gain and may be non-linear and temperature dependent as well.

An inhibit circuit for a differential amplifier in accordance with the present invention comprises a pair of non-additive combiners or mixers, each having an output connected to a respective input of the amplifier and input circuitry for applying an a.c. signal to be amplified to a selected input of at least one of the combiners. A control circuit is operable in a first condition for applying control voltages to respective inputs of the combiners for causing the one combiner to block the a.c. signal and also causing both combiners to apply a common mode input voltage of a first value to the amplifier inputs. The control circuit is operable in a second condition for changing the values of the control voltages in a sense to cause one combiner to pass the a.c. signal and also causing both combiners to apply a common mode input voltage of a second value to the amplifier inputs whereby, in either condition, the amplifier produces a constant quiescent d.c. output voltage.

Figure 1:
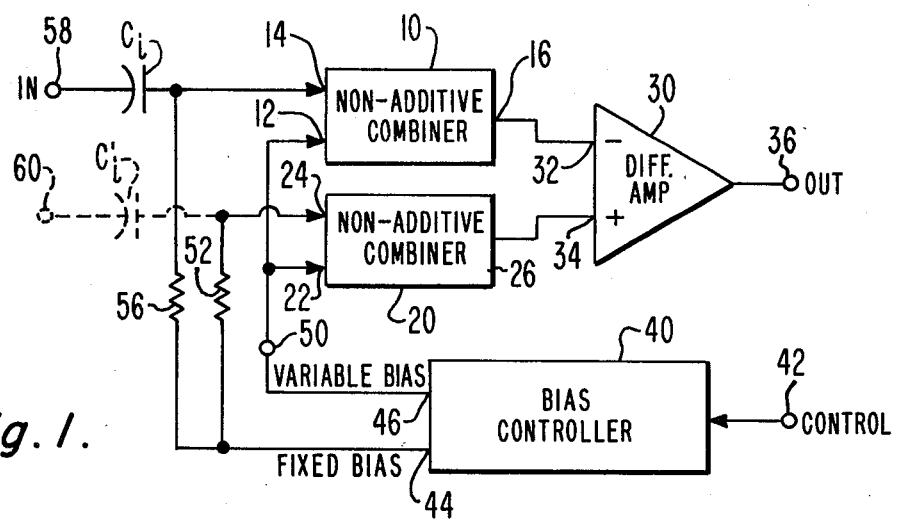
FIG. 1 is a block diagram partially in schematic form of an inhibit circuit embodying the present invention and used with a differential amplifier in an open loop configuration.

In FIG. 1 a pair of non-additive combiners (mixers) 10 and 20 are connected at their respective outputs 16 and 26 to the inverting, 32, and non-inverting, 34, inputs of differential amplifier 30. A bias controller 40 having an input 42 for receiving a control signal produces a fixed bias voltage at a first output 44 thereof and a variable bias voltage at a second output 46 thereof. A conductor 50 is connected to apply the variable bias voltage at output 46 to the first inputs 12 and 22 of non-additive combiners 10 and 20 respectively. A resistor 52 is connected to apply the fixed bias voltage at output 44 of bias controller 40 to a second input 24 of combiner 20. Resistor 56 is connected between output 44 of bias controller 40 and the second input 14 of non-additive combiner 10 for applying the fixed bias voltage thereto. An input terminal 58 for receiving an input signal to be amplified is coupled via a direct-current blocking capacitor $C_i$ to the second input 14 of combiner 10. As will be discussed subsequently, the capacitor $C_i$ may be connected to any of the inputs of non-additive combiners 10 and 20. If desired, a second input coupling capacitor $C_i$ (indicated by dashed lines) may be connected between a second input terminal 60 and input 24 of combiner 20 for amplifying differential-mode input signals applied across input terminals 58 and 60.

Differential amplifier 30 may be of conventional design employing bipolar or field effect transistors in its input stage and producing an output voltage at its output 36 representative of the difference of the input voltages applied to its inverting 32 and non-inverting 34 inputs. As is known, differential amplifiers have the characteristic of amplifying differential-mode components and rejecting common-mode components of their input signals. As will be explained subsequently, non-additive combiners 10 and 20 cause the common-mode voltage at the inputs of amplifier 30 to vary in response to signals from bias controller 40, but this variation (being a common-mode voltage) does not affect the d.c. quiescent output voltage of amplifier 30.

Non-additive combiners 10 and 20 may also be of conventional design. See for example, U.S. Pat. No. 3,371,160 entitled "Television Circuit For Non-Additively Combining A Pair Of Video Signals" which was issued to W. L. Hurford, Feb. 27, 1968. A non-additive combiner (or "non-additive mixer"), as is known, is a circuit arrangement which delivers to an output terminal only one of two input signals supplied to it depending upon the relative polarity or relative magnitudes of the two input signals. By appropriate selection of the transistor types and reference voltages one may construct a combiner which transmits only the more positive of the input signals to its output. FIG. 1 of the Hurford patent shows such a combiner as well as FIGS. 3 and 4 herein. Alternatively, by reversing transistor conductivity type and supply voltages one may construct a combiner which transmits only the more negative of its input signals to its output. Either type of combiner may be used to practice the present invention. Regardless of which type is used, however, it is preferable that the combiner provide an impedance transformation between its input and output which is characteristic of the "active" combiners illustrated in FIGS. 3 and 4 herein. "Passive" combiners of the kind comprising a pair of diodes forward biased by means of a current source may be used with the invention with some sacrifice in performance due to the series resistance and non-linear characteristics of the diode junctions.

Figure 3:
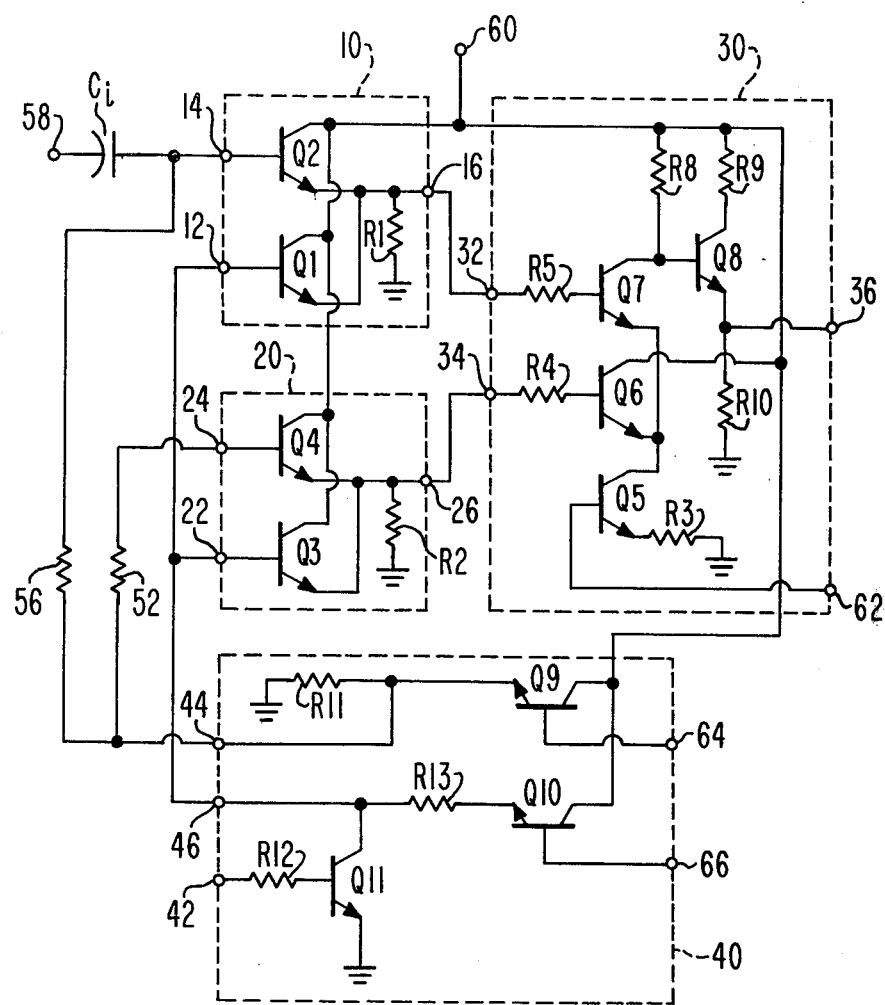
FIG. 3 is a detailed schematic diagram corresponding to the embodiment of FIG. 1.
Figure 4:
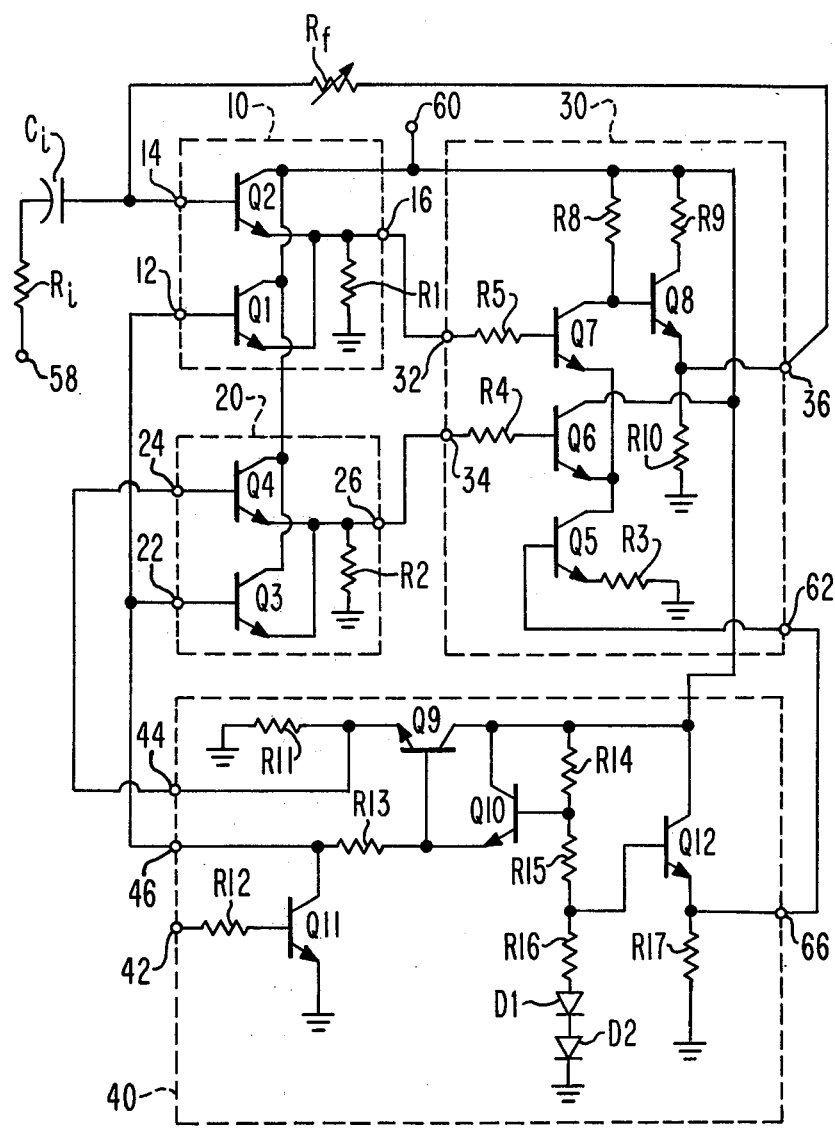
FIG. 4 is a detailed schematic diagram corresponding to the embodiment to FIG. 2.

Bias controller 40 produces a fixed bias voltage at output 44 and a variable bias voltage at output 46 which is of controllable polarity relative to the fixed bias voltage in response to a control signal applied to terminal 42. The construction of controller 40 is not critical and FIGS. 3 and 4 give two examples of how controller 40 may beimplemented. It is advantageous, however, that both the variable and the fixed bias voltages be derived from the same voltage source as is done in the example of FIG. 4 so that the relationship between the voltages (i.e., their relative values) is not affected by changes in the supply voltage.

In the following discussion of operation of the inhibit circuit, assume first that a control signal is applied to input 42 of bias controller 40 of a value such that the fixed bias voltage at output 44 is more positive than the variable bias voltage produced at output 46. Assume also that non-additive combiners 10 and 20 are of the type which transmit the more positive of their respective input signals to their respective output terminals. Under these assumptions inputs 14 and 24 of combiners 10 and 20 respectively, will be coupled to the inverting, 32, and non-inverting, 34, inputs of amplifier 30. Accordingly, amplifier 30 will receive a common mode input voltage equal to the fixed bias voltage supplied by bias controller 40 less any offset voltage which may occur across resistors 52 and 56 or which may be introduced by the combiners 10 and 20.

Summarizing to this point, under the above conditions bias control 40 applies a fixed bias voltage via resistors 52 and 56 and combiners 10 and 20 to both inputs of amplifier 30. Since these voltages are equal they represent a common-mode input voltage component which is not amplified by amplifier 30 so that its output voltage will assume some quiescent value. If now, an input signal is applied to input terminal 58, it will be coupled via capacitor $C_i$ and combiner 10 to the inverting input terminal 32 of amplifier 30. Since the input signal is applied only to one of the amplifier input terminals it will appear as a differential-mode component of input signal for amplifier 30 and so will be amplified. This represents the non-inhibited mode of operation of the circuit.

Assume now that the control voltage at input 42 changes in a sense to cause bias controller 40 to increase the value of the variable bias voltage at output 46 to a value more positive than the fixed bias voltage at output 44. Under this condition, combiner 10 will supply an output voltage to the inverting input of amplifier 30 representative of the variable bias voltage at its first input 12 and combiner 20 will supply a voltage to the non-inverting input of amplifier 30 also representative of the variable bias voltage applied to its first input 22. Amplifier 30 will thus receive equal voltages at its input terminals and so will produce a quiescent output d.c. voltage of the same value it produced in the previous case where the common-mode voltage was lower. In this case, however, no differential-mode signal components can reach the inputs of amplifier 30 because the coupling capacitor $C_i$ is connected to the second input of combiner 10 which is at a lower d.c. voltage than its first input 12. Accordingly, amplifier 30 is inhibited because combiner 10 blocks the differential-mode signal component and both combiners 10 and 20 pass a now higher level common-mode voltage component to its input terminals. The fact that the common-mode voltage level changes between the inhibit and non-inhibit modes of operation of the circuit has no affect on amplifier 30 because it is a differential amplifier and thus rejects common-mode voltage regardless of its magnitude and so produces an output voltage of a constant quiescent value in either mode of operation.

Resistors 52 and 56 provide the functions of (1) coupling the fixed bias voltage to combiners 10 and 20, and (2) isolating the second input of combiner 10 from the second input 24 of combiner 20. If this isolation were not done the signal coupled by input capacitor $C_i$ would otherwise appear at both combiner inputs and so would be presented as a common-mode signal to the differential amplifier rather than a differential-mode signal and thus could not be amplified.

Figure 2:
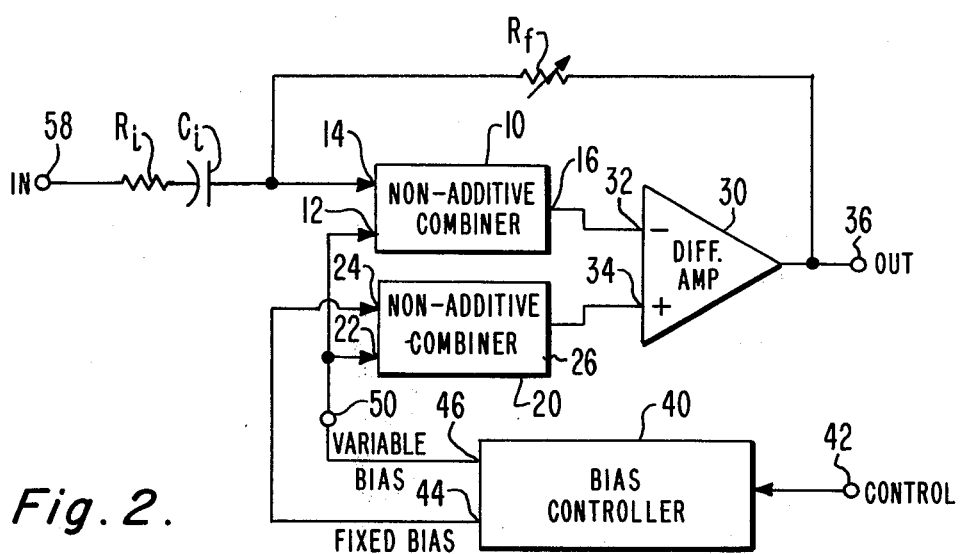
FIG. 2 is a block diagram partially in schematic form of an inhibit circuit embodying the present invention and used with a differential amplifier in a closed loop configuration.

Relatively simple modifications of the open loop configuration of FIG. 1 may be made to transform it into a closed loop amplifier configuration as shown in FIG. 2. In FIG. 2 d.c. bias for the second input 14 of combiner 10 is provided by a feedback resistor $R_f$ connecting the second input 14 of combiner 10 to output 36 of amplifier 30. This feedback resistor, $R_f$, in combination with the input resistor $R_i$ (in series with input capacitor $C_i$) also determines the closed loop gain of the amplifier. It may be variable as indicated or alternatively the input resistor $R_i$ may be made variable for controlling the a.c. gain of the amplifier (the d.c. gain is zero owing to the presence of capacitor $C_i$ which blocks d.c. components of the input signal to be amplified). Since d.c. bias for input 14 of combiner 10 is derived from the output of amplifier 30 there is no need for resistor 56, and resistor 56 has been deleted in FIG. 2. With resistor 56 removed from the circuit there is also no further need for resistor 52 and it has been replaced by a direct connection of the second input 24 of combiner 20 to output 44 of bias controller 40.

Operation of the inhibit circuit of FIG. 2 is in its essential respects the same as that previously described for FIG. 1 but differs mainly in that the d.c. bias voltage for input 14 is indirectly rather than directly derived from output 44 of the controller 40. The following two examples will illustrate this point.

First, assume that the control voltage at terminal 42 of bias controller 40 is of such a value that the fixed bias voltage at output 44 is more positive than the variable bias voltage at output 46, and that combiners 10 and 20 are of the type which transmit the more positive voltage at their inputs to their respective outputs. Combiner 20 will thus apply the fixed bias voltage produced by controller 40 to the non-inverting input 34 of amplifier 30

(less, of course, any offset voltage produced across combiner 20). Since the feedback loop of amplifier 30 is closed by means of feedback resistor $R_f$ a voltage will be applied at input 14 of combiner 10 of such a value as to cause the voltage at inverting input 32 to equal the voltage at non-inverting input 34 of amplifier 30. Assuming that the combiners exhibit equal offset voltages (if any), the voltage at input 14 will thus equal the voltage at input 24 and so will necessarily be greater than the variable bias voltage applied to inputs 12 and 22. Thus combiner 10 will conduct the a.c. input signal voltage supplied by resistor $R_i$ and capacitor $C_i$ to the inverting input terminal of amplifier 30 and an amplified output signal will be produced.

One may verify that the d.c. voltage at terminal 14 will equal the fixed bias voltage produced by controller 40 by analyzing what would happen if the voltage at the inverting and non-inverting inputs of differential amplifier 30 should differ. For example, if the voltage at input 32 tended to be more positive than that at input 34, the output voltage at 36 would decrease thereby reducing the voltage at 14 and thus the voltage at 32. Conversely if the voltage at 32 tended to be more negative than that at 34 the output voltage at 36 would increase thereby increasing the voltage at 14 and returning the voltage at 32 to a condition of equality with that at 34.

Assume now that the control voltage at input 42 is of such a value as to cause the variable bias voltage produced by controller 40 to be greater than the fixed bias voltage. In this case, combiner 20 will apply the variable bias voltage to the non-inverting input 34 of amplifier 30. Combiner 10 will also apply the variable bias voltage to inverting input 32 of amplifier 30 and simultaneously will decouple the a.c. signal from its inverting input terminal. This represents the inhibit mode of operation of the circuit and the question then is whether a change in quiescent d.c. output level of amplifier 30 will occur.

Recall from the previous discussion of the enabled mode that the output of amplifier 30 assumed a d.c. voltage level sufficient to maintain input 14 of combiner 10 at the same potential as that at input 24 of combiner 20 (i.e., the fixed bias voltage). In the inhibit mode, however, the feedback loop for amplifier 30 is essentially open circuited so that the output of amplifier 30 must assume some quiescent value, Vo, which depends mainly on how well balanced the amplifier is. To assure that there is no change in the quiescent d.c. output level between the two modes of operation one may either (1) adjust the balance of amplifier 30 or (2) adjust the value of the fixed bias voltage until there is no change in Vo in switching between the enabled and inhibited modes of operation.

As an illustration, assume that amplifier 30 when operated in an open loop mode normally produces an output voltage equal to half its supply voltage ($V_s/2$) in response to a commond mode input voltage. If one selects the fixed bias voltage to equal $V_s/2$ then in the enabled mode of operation the output voltage at 36 will also equal $V_s/2$ because the feedback loop is closed and it must regulate the voltage at input 14 to equal that at input 24 (from the previous discussion). In the inhibit mode of operation the feedback loop is broken because the variable voltage at combiner inputs 12 and 22 exceeds that at inputs 14 and 24. Accordingly, amplifier 30 receives a higher common-mode input voltage but since the feedback loop is essentially open its output must assume its nominal value of $V_s/2$ which was previously assumed. Thus, by selecting the fixed bias voltage equal to the nominal open loop quiescent voltage of amplifier 30 for common-mode input conditions there is no change in quiescent output voltage for either mode of operation.

In the schematic diagram of FIG. 3 combiner 10 comprises transistors Q1 and Q2 having base electrodes connected respectively to the first and second inputs 12 and 14 and emitter electrodes commonly connected to output 16. The collectors of transistors Q1 and Q2 are coupled to a supply voltage terminal 60 for receiving operating voltage and the emitters are coupled to ground via resistor R1. The purpose of resistor R1 is to serve as an emitter load or current source for whichever of the two transistors Q1 and Q2 is conductive. In operation, if the voltage at input 12 is greater than that at 14 transistor Q1 will operate as an emitter follower to regulate the voltage at output 16 at a value $1V_{be}$ below that at input 12 which will also reverse bias the base-emitter junction of transistor Q2 assuring that any a.c. signal which may be present at terminal 14 cannot be conducted to output 16. Combiner 10 is thus of a kind previously described which supplies an output voltage proportional to the more positive of the two input voltages supplied to its input terminals.

Combiner 20 comprises transistors Q3 and Q4 and resistor R2 which are arranged identically as transistors Q1 and Q2 and resistor R1 in combiner 10. The base electrodes of Q3 and Q4 are connected, respectively, to inputs 22 and 24 and their emitter electrodes are commonly connected to output 26.

Differential amplifier 30 comprises a current source transistor Q5 connected at its base electrode to a bias voltage input terminal 62, at its emitter electrode to ground via a resistor R3 and at its collector electrode to the commonly connected emitter electrodes of transistors Q6 and Q7. Transistor Q5 and resistor R3 operate as a constant current source responsive to the bias voltage applied to terminal 62 for supplying the "tail current" to transistors Q6 and Q7 which comprise an emitter coupled differential amplifier. The base electrodes of Q6 and Q7 are respectively connected to the non-inverting input terminal 34 and the inverting input terminal 32 of the amplifier via respective base bias current equalization resistors R4 and R5. Those resistors serve mainly to balance the input connections of transistors Q6 and Q7 and may be omitted if Q6 and Q7 are well matched or otherwise do not require additional means for balancing or equalizing their characteristics. Alternatively, resistors might be inserted in the respective emitter connections of Q6 and Q7 to improve the balancing of the amplifier.

The collector of transistor Q6 is connected directly to the supply voltage terminal 60 to receive operating voltage. The collector of transistor Q7 is connected to supply terminal 60 via resistor R8 which serves as a load resistor that develops the amplifier output voltage which is proportional to the collector current of transistor Q7. The collector of Q7 is also connected to the base of emitter follower transistor Q8 the collector of which connects to supply terminal 60 via current limiting resistor R9 and the emitter of which connects to output terminal 36 and to ground via load resistor R10.

In operation, with a bias voltage applied to terminal 62, the collector of transistor Q5 supplies current to the emitters of Q6 and Q7 which is divided at their collector electrodes in proportion to the voltages at their base electrodes. If the voltage at inputs 32 and 34 are equal then transistors Q6 and Q7 will conduct equal collector current and a voltage drop will be produced across resistor R8 equal to its value multiplied by one half the value of the current supplied by transistor Q5. If the voltage at input 32 should be more positive than that of 34 transistor Q7 will conduct a larger current and transistor Q6 a lesser current so that a larger collector voltage drop will occur across resistor R8. Accordingly the output voltage at output 36 will decrease. Input 32 thus corresponds to the inverting input of the amplifier since the output voltage decreases when the voltage at terminal 32 exceeds that at input 34.

Bias controller 40 comprises an emitter follower transistor Q9 having a base electrode connected to an input 64 for receiving a fixed bias voltage, a collector electrode connected to supply terminal 60 and an emitter electrode connected to output 44 and to ground via load resistor R11. The voltage produced at output 44 is thus equal to the fixed bias voltage applied to input 64 minus the base-emitter voltage, $V_{be}$, of Q9. Transistor Q10, which also operates as an emitter follower, is connected at its collector electrode to supply terminal 60 and at its base electrode to an input 66 for receiving a bias voltage more positive than that applied to input 64. Thus the emitter voltage of Q10 is always greater than that of Q9 and this assures that the maximum value of the variable bias voltage produced in terminal 46 will always exceed that of the fixed bias voltage at output 44. Transistor Q11 is a switching transistor connected in a common emitter configuration for controlling the variable bias voltage. The base of Q11 is coupled to control terminal 42 via current limiting resistor R12 and the collector of Q11 is connected to output 46 and to the emitter of transistor Q10 via current limiting resistor R13.

In operation, if control terminal 42 is grounded the transistor Q11 will be turned off so that transistor Q10 will apply the maximum value of the variable bias voltage to output 46 (the voltage drop across resistor R13 being insignificant since it only conducts the relatively small base currents of transistors Q1 and Q3). If now a positive control voltage is applied to input 42, transistor Q11 will turn on and clamp the potential at output 46 to ground thereby causing the variable bias voltage to be less than the fixed bias voltage at output 44.

Overall operation of the inhibit circuit of FIG. 3 is the same as that previously described in the discussion of FIG. 1. It is important to note however, that the same basic circuit operation can be obtained even if combining circuits 10 and 20 are replaced by the type which transmit the more negative of the respective input voltages to their respective output terminals. The only difference this would have on the circuit operation would be to reverse the mode of operation for a given value of a control voltage at input 42. For example, with the illustrated combiners, when input 42 is grounded, amplifier 30 is inhibited because terminals 12 and 22 receive voltages more positive than terminals 14 and 24. If combiners 10 and 20 were replaced with the type responsive to the more negative input signal then under the same condition of the control voltage at input 42 (grounded) amplifier 30 would be enabled rather than inhibited. One may implement a combiner having such a complimentary characteristic by replacing transistors Q1–Q4 with PNP transistors rather than NPN transistors and connecting the load resistors R1 and R2 to the supply terminal 60 and connecting the collector electrodes to ground.

Although combiners 10 and 12 have been illustrated with bipolar transistors they may be replaced if desired with field effect transistors. Regardless of the transistor types employed however, it is desirable as previously mentioned that the combiners include some form of active amplifying device to provide an impedance transformation between its input and output. The combiners shown provide such a transformation which has the advantage of increasing the input impedance at terminals 12, 14, 22 and 24 and providing a very low output impedance at terminals 16 and 26 for driving the differential amplifier inputs 32 and 34. This has the effect of increasing the overall gain of the inhibit circuit and amplifier combination.

In FIG. 4 combiners 10 and 20 and amplifier 30 are the same as previously described in FIG. 3. The circuit differs from FIG. 3 (in addition to being a closed loop rather than an open loop configuration) in that bias controller 40 has been modified to include a potential divider comprising resistors R14, R15 and R16 and two diodes D1 and D2 connected in series in that order between supply terminal 60 and ground. The common connection of resistors R14 and R15 is connected to the base of transistor 10 for supplying a fixed positive voltage thereto derived from the supply voltage at terminal 60. The base of transistor Q9, rather than being connected to a separate supply, is connected to the emitter of transistor 10 which thereby assures that the fixed bias voltage produced at output 44 is always $1V_{be}$ less than the maximum variable bias voltage produced at output 46 (transistors Q9 and Q10 may be viewed as a Darlington pair). A further change in bias controller 40 is that the common connection of resistors R15 and R16 is coupled to the base electrode of an emitter follower transistor Q12 the collector of which connects to supply terminal 60 and the emitter of which connects to ground via load resistor R17. The output voltage of emitter follower Q12 at output 66 of bias controller 40 is applied to input 62 of amplifier 30 for regulating the emitter current of transistors Q6 and Q7.

These changes do not affect the general operation of the inhibit circuit of FIG. 2 previously discussed but provide improvement in terms of supply voltage stability. This results because the fixed bias voltage and the variable bias voltage are both derived from the same supply (via potential divider R14, R15, R16) and so a change in the supply voltage cannot adversely affect the polarity of the output bias voltage relative to the fixed bias voltage for a given operating mode. The quiescent current for differential amplifier 30 also "tracks" the supply voltage so that the quiescent d.c. output voltage of the amplifier is always maintained at a fixed fraction of the supply voltage.

What is claimed is:

1. An inhibit circuit for a differential amplifier, comprising:
   a pair of non-additive combiners, each having an output connected to a respective input of said amplifier;
   input means for selectively coupling a signal to be amplified to a given input terminal of one of said combiners;
   a bias controller having a first output for producing a fixed bias voltage and a second output for producing a variable bias voltage, said bias controller having an input responsive to a control signal supplied thereto for controlling the polarity of said variable bias voltage relative to said fixed bias voltage;

first means for applying said variable bias voltage to a first input of each of said combiners;

second means for applying said fixed bias voltage to a second input of one of said combiners; and a feedback resistor connected between said output of said differential amplifier and said second input of said other of said combiners.

2. An inhibit circuit for a differential amplifier as recited in claim 8 wherein said bias controller comprises:

a potential divider across which a supply voltage is applied, said potential divider having an output tap;

a Darlington connection of first and second transistors, the first transistor having a control electrode connected to said tap and an output electrode connected to the control electrode of the second transistor;

means for coupling the output electrode of the second resistor to said first output of said bias controller; and means for coupling the output electrode of the first transistor to said second output of said bias controller.

* * * * *